US009699883B2

United States Patent
Dede et al.

(10) Patent No.: US 9,699,883 B2
(45) Date of Patent: Jul. 4, 2017

(54) THERMAL SWITCHES FOR ACTIVE HEAT FLUX ALTERATION

(71) Applicant: Toyota Motor Engineering & Manufacturing North America, Inc., Erlanger, KY (US)

(72) Inventors: Ercan Mehmet Dede, Ann Arbor, MI (US); Debasish Banerjee, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 29 days.

(21) Appl. No.: 14/592,298

(22) Filed: Jan. 8, 2015

(65) Prior Publication Data

US 2016/0205761 A1 Jul. 14, 2016

(51) Int. Cl.
*H01L 33/00* (2010.01)
*H05K 1/02* (2006.01)
*H01L 23/34* (2006.01)
*H01L 23/36* (2006.01)

(52) U.S. Cl.
CPC ............ *H05K 1/0201* (2013.01); *H01L 23/34* (2013.01); *H01L 23/36* (2013.01)

(58) Field of Classification Search
CPC ...................................................... H01L 35/32
USPC ............................................. 438/485; 257/99
See application file for complete search history.

(56) References Cited

U.S. PATENT DOCUMENTS

| 7,177,516 | B1* | 2/2007 | Ahn | G01J 1/04 |
| | | | | 385/131 |
| 7,411,792 | B2 | 8/2008 | Richards et al. | |
| 7,755,899 | B2 | 7/2010 | Stenmark | |
| 2006/0180192 | A1* | 8/2006 | Sharp | H01L 23/38 |
| | | | | 136/224 |
| 2008/0257395 | A1* | 10/2008 | Jovanovic | H01L 29/155 |
| | | | | 136/239 |
| 2008/0258690 | A1 | 10/2008 | Odagawa et al. | |
| 2009/0025770 | A1* | 1/2009 | Lofy | H01L 35/32 |
| | | | | 136/201 |

(Continued)

FOREIGN PATENT DOCUMENTS

| JP | H09-045827 | 2/1997 |
| JP | 2004047783 | 2/2004 |
| JP | 2008258199 | 10/2008 |

OTHER PUBLICATIONS

Savo et al., Reconfigurable Anisotropy and Functional Transformations with VO2-Based Metamaterial Electric Circuits, http://arxiv.org/abs/1405.7743, May 29, 2014.

(Continued)

*Primary Examiner* — Igwe U Anya
(74) *Attorney, Agent, or Firm* — Dinsmore & Shohl LLP

(57) ABSTRACT

A thermal switch includes a substrate having a target region and a peripheral region. A metallization array is coupled to the substrate and is positioned adjacent the target region, the metallization array including a plurality of first temperature dependent thermally conductive metallization segments and a plurality of second temperature dependent thermally conductive metallization segments. The metallization array directs heat flux toward the target region within a first temperature range and directs heat flux away from the target region within a second temperature range.

20 Claims, 10 Drawing Sheets

(56) References Cited

U.S. PATENT DOCUMENTS

| | | | | |
|---|---|---|---|---|
| 2010/0037624 A1* | 2/2010 | Epstein | ............... | F25B 21/00 |
| | | | | 62/3.1 |
| 2011/0216388 A1* | 9/2011 | Granqvist | ............ | G02F 1/0147 |
| | | | | 359/265 |
| 2013/0139524 A1* | 6/2013 | Kim | ............... | F25B 21/02 |
| | | | | 62/3.7 |
| 2013/0141872 A1 | 6/2013 | Schwartz | | |
| 2013/0148302 A1 | 6/2013 | Ben Jamaa et al. | | |
| 2013/0195616 A1* | 8/2013 | Epstein | ............... | F01D 25/12 |
| | | | | 415/1 |
| 2014/0210628 A1 | 7/2014 | Kim et al. | | |
| 2014/0266391 A1* | 9/2014 | Parkin | ............... | H01L 45/04 |
| | | | | 327/365 |
| 2014/0313716 A1* | 10/2014 | Lang | ............... | H01L 35/30 |
| | | | | 362/235 |
| 2014/0318829 A1* | 10/2014 | Dede | ............... | H05K 1/0203 |
| | | | | 174/251 |
| 2014/0356985 A1* | 12/2014 | Ricci | ............ | H01L 21/67109 |
| | | | | 438/11 |
| 2015/0097207 A1* | 4/2015 | Chen | ............... | H01L 23/38 |
| | | | | 257/99 |

OTHER PUBLICATIONS

Narayana et al., Heat Flux Manipulation with Engineered Thermal Materials, American Physical Society, Physical Review Letters, PRL 108:214303-1-5, May 25, 2012.

\* cited by examiner

THERMAL SWITCHES FOR ACTIVE HEAT FLUX ALTERATION

TECHNICAL FIELD

The present specification generally relates to heat flux manipulation and, more particularly, to thermal switches that provide active heat flux alteration on a substrate.

BACKGROUND

Thermal management devices can be configured to control the direction of heat flux toward or away from objects. Current methods for heat flux control involve the use of materials having thermal conductivities that are independent of temperature. This results in passive heat management devices that cannot provide both heat flux removal and heat flux amplification based on operating temperatures using a single device.

Accordingly, there is a need for thermal management devices that can provide active heat flux alteration including heat flux shielding and heat flux amplification, depending on the temperature applied to the device.

SUMMARY

In one embodiment, a thermal switch including a substrate having a target region and a peripheral region. A metallization array is coupled to the substrate and is positioned adjacent to the target region, the metallization array includes a plurality of first temperature dependent thermally conductive metallization segments and a plurality of second temperature dependent thermally conductive metallization segments. The metallization array directs heat flux toward the target region within a first temperature range and directs heat flux away from the target region within a second temperature range.

In another embodiment, a device includes a thermal switch including a substrate having a target region and a peripheral region. A metallization array is coupled to the substrate and is positioned adjacent to the target region, the metallization array including a plurality of first temperature dependent thermally conductive metallization segments and a plurality of second temperature dependent thermally conductive metallization segments. The metallization array directs heat flux toward the target region within a first temperature range and directs heat flux away from the target region within a second temperature range. A heat sink is thermally coupled to the target region of the substrate and/or the peripheral region of the substrate and a heat source is thermally coupled to the target region of the substrate and/or the peripheral region of the substrate.

In yet another embodiment, a thermal switch including a substrate having a target region and a peripheral region, and a metallization array coupled to the substrate and arranged in a circular band. The metallization array includes a plurality of low temperature activated temperature dependent thermally conductive metallization segments including a plurality of concentric rings that circumscribe the target region and a plurality of high temperature activated temperature dependent thermally conductive metallization segments comprising a plurality of spokes. Each individual spoke extends between at least two concentric rings of the plurality of low temperature activated temperature dependent thermally conductive metallization segments. The metallization array directs heat flux toward the target region within a first temperature range and directs heat flux away from the target region within a second temperature range. The first temperature range has a first average temperature that is lower than a second average temperature of the second temperature range.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to thermal switches for active heat flux control. The thermal switches can be thermally dependent such that within a first temperature range the thermal switch provides heat flux shielding with respect to a target region, and, within a second temperature range, the thermal switch provides heat flux amplification with respect to the target region. During heat flux amplification, the thermal switch directs heat flux toward the target region. During heat flux shielding, the thermal switch directs heat flux away from the target region, (e.g., to release some of the heat flux onto a surrounding peripheral region). The heat flux amplification or heat flux shielding operation of the thermal switch may be controlled using temperature dependent thermal conductive materials arranged in a metallization array positioned on a substrate. Various embodiments of thermal switches and electronic devices are described in detail below.

Figure 1:
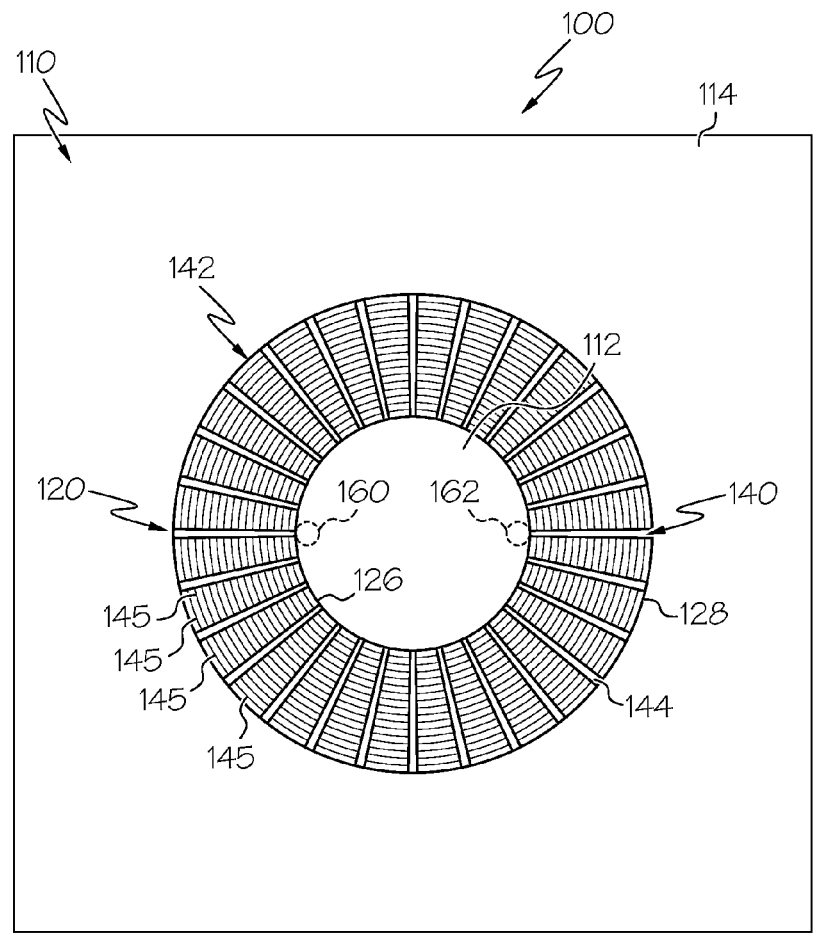
FIG. 1 schematically depicts a top view of an example thermal switch having a metallization array arranged in a circular band according to one or more embodiments described herein.

Referring now to FIG. 1, a top view of an exemplary thermal switch 100 is depicted. The thermal switch 100 depicted in FIG. 1 includes a metallization array 120 coupled to a substrate 110 using any known coupling method, for example, metallization coating, thermal spraying, chemical etching, vacuum metalizing, condensation depositing, and the like. The metallization array 120 separates the substrate 110 into a target region 112 and a peripheral region 114, each positioned adjacent the metallization array 120. The substrate 110 may comprise one or more materials, for example, one or more non-temperature dependent thermally conductive materials. For example, the target region 112 may comprise a first material, such as a first non-temperature dependent thermally conductive material and the peripheral region 114 may comprise a second material, such as a second non-temperature dependent thermally conductive material, which may comprise the same or different materials. Exemplary substrate materials include, but are not limited to, FR-4, copper, and a combination for FR-4 and copper, as described with respect to FIG. 6, below. In some embodiments, the substrate 110 may additionally comprise a third material, such as a third non-temperature dependent thermally conductive material.

Referring still to FIG. 1, the metallization array 120 comprises a plurality of first temperature dependent thermally conductive metallization segments 142 positioned adjacent and/or alternate a plurality of second temperature dependent thermally conductive metallization segments 144, which each comprise a temperature dependent thermally conductive material. Temperature dependent thermally conductive material is material having a thermal conductivity that varies depending on a temperature applied to the material. The plurality of first and second temperature dependent thermally conductive metallization segments 142, 144 may comprise a low temperature activated temperature dependent thermally conductive material and a high temperature activated temperature dependent thermally conductive material, such that the metallization array 120 includes an arrangement of both low and high temperature activated temperature dependent thermally conductive materials, as described in detail below. The plurality of first and second temperature dependent thermally conductive metallization segments 142, 144 may be thin film materials. The metallization array 120 can be arranged in a variety of patterns, and includes a first side 126 positioned adjacent the target region 112 of the substrate 110 and a second side 128 positioned adjacent the peripheral region 114 of the substrate 110. In other embodiments, the first side 126 is positioned adjacent the peripheral region 114 and the second side 128 is positioned adjacent the target region 112.

Figure 2:
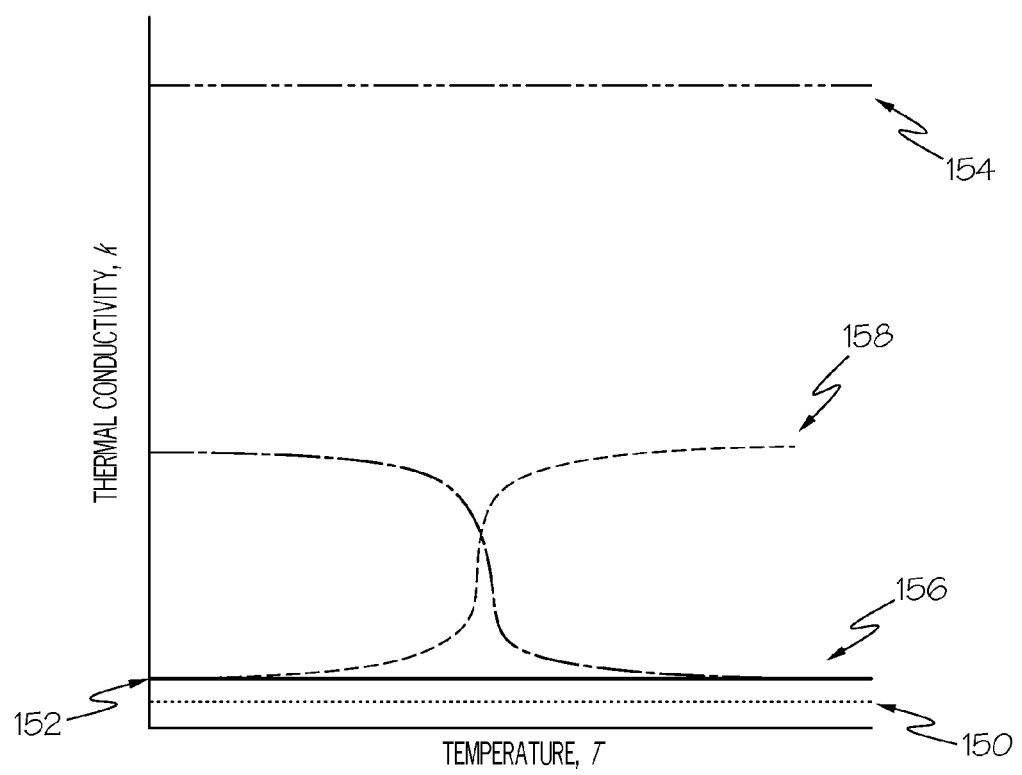
FIG. 2 depicts a graph measuring thermal conductivity vs. temperature of various materials according to one or more embodiments described herein.

The metallization array 120 includes both low temperature activated temperature dependent thermally conductive material and high temperature activated temperature dependent material. The low temperature activated temperature dependent thermally conductive material has a higher thermal conductivity at temperatures below a threshold temperature range than at temperatures above the threshold temperature range, as described with respect to FIG. 2, below. The high temperature activated temperature dependent thermally conductive material has a higher thermal conductivity at temperatures above the threshold temperature range than at temperatures below the threshold temperature range, as depicted in FIG. 2, below. In some embodiments, the plurality of first temperature dependent thermally conductive metallization segments 142 comprise a single low temperature activated temperature dependent thermally conductive material and the plurality of second temperature dependent thermally conductive metallization segments 144 comprise a single high temperature activated temperature dependent thermally conductive material. The opposite arrangement of materials is also contemplated.

Exemplary low temperature activated temperature dependent thermally conductive materials include $Al_2O_3$, sapphire, or BeO and exemplary high temperature activated temperature dependent thermally conductive materials include metal insulator transition materials, $VO_2$, $SmNiO_3$, $TiO_3$, a transition metal perovskite, ZnBiTeSe, or $FeSb_2$, as well as narrow bandgap semiconductor materials such as $Ge_2Sb_2Te_5$, or phase change materials such as TiN, $WN_2$, C, or the like. These materials are arranged relative to each other to create a metallization array 120 that can alter heat flux and operate as a heat flux shield within a first temperature range and a heat flux amplifier within a second temperature range. The metallization array 120 switches from a heat flux amplifier to a heat flux shield within a threshold temperature range, which is positioned substantially between the first temperature range and the second temperature range.

Referring now to FIG. 2, a graph showing the thermal conductivity versus temperature (κ/T) of materials utilized in the various embodiments of the thermal switch 100 is depicted. The materials include a first non-temperature dependent thermally conductive material (curve 150), a second non-temperature dependent thermally conductive material (curve 152), a third non-temperature dependent thermally conductive material (curve 154), a low temperature activated temperature dependent thermally conductive material (curve 156), and a high temperature activated temperature dependent thermally conductive material (curve 158).

As depicted in FIG. 2, each of the non-temperature dependent thermally conductive materials have a thermal conductivity that is unaffected by temperature. The first non-temperature dependent thermally conductive material (curve 150) has a lower thermal conductivity than the second non-temperature dependent thermally conductive material (curve 152), which has a lower thermal conductivity than the third non-temperature dependent thermally conductive material (curve 154). Example non-temperature dependent thermally conductive materials include, but are not limited to, copper, (having a thermal conductivity of about 400 W/mK), FR-4, (having a thermal conductivity of about 0.25 W/m K), and other insulators or combinations thereof. As an example and not a limitation, a combination of FR-4 and copper may have a thermal conductivity of about 0.5 W/mK. In some embodiments, the first non-temperature dependent thermally conductive material comprises FR-4, the second non-temperature dependent thermally conductive material comprises a combination of copper and FR-4 and the third non-temperature dependent thermally conductive material comprises copper. It should be understood that other non-temperature dependent thermally conductive materials, either alone or in combination, are contemplated.

Referring still to FIG. 2, the low temperature activated temperature dependent thermally conductive material (curve 156) may include materials having a thermal conductivity that decreases as temperatures increase. Exemplary low temperature activated temperature dependent thermally conductive materials include, but are not limited to, $Al_2O_3$, (having a thermal conductivity of 30 W/mK at room temperature (RT) and 20 W/mK at 100 C.°), sapphire, (having a thermal conductivity of 45 W/mK at RT and 30 W/mK at 100 C.°), (BeO, having a thermal conductivity of 200 W/mK at RT and 100 W/mK at 100 C.°), and Si, (having a thermal conductivity of 150 W/mK at RT and 100 W/mK at 100 C.°). Other low temperature activated temperature dependent thermally conductive materials are contemplated, including crystalline materials. While not intending to be limited by theory, many crystalline materials are low temperature activated temperature dependent thermally conductive materials due to the increase of 3-phonon scattering processes at higher temperatures. Further, within the threshold temperature range, the rate of change of thermal conductivity may be increased for the low temperature activated temperature dependent thermally conductive materials, which may facilitate the thermal switching functionality of the thermal switch 100.

Referring still to FIG. 2, the high temperature activated temperature dependent thermally conductive material (curve 158) may include materials having thermal conductivity that increases as temperatures increase. Exemplary high temperature activated temperature dependent thermally conductive materials include, but are not limited to, $VO_2$, (having a thermal conductivity of about 5 W/mK below 67 C.° and about 10 W/mK above 67 C.°), transition metal oxides, (e.g., transition metal perovskites, such as, PrCaCoO, SmCaCoO, GdCaCoO, and the like, having a thermal conductivity of about 1.5 W/mK at RT and about 4 W/mK at 500 C.°), metal alloys, (e.g., ZnBiTeSe, $FeSb_2$, and other narrowband semiconductor materials, having a thermal conductivity of 5 W/mK at RT and 15 W/mK at 500 C.°), and phase change materials (e.g., TiN, $WN_2$, C, or the like, having a thermal conductivity of about 4 W/mK at RT and about 9 W/mK at 400 C.°). Other exemplary high temperature activated temperature dependent thermally conductive materials include $SmNiO_3$, and $TiO_3$. Further, within the threshold temperature range, the rate of change of thermal conductivity may be increased for the high temperature activated temperature dependent thermally conductive materials, which may facilitate the thermal switching functionality of the thermal switch 100.

In some embodiments, the thermal conductivities of the various materials are interrelated. For example, the thermal switch 100 can include materials having thermal conductivities which meet the following condition: $\kappa_e^2 \sim \max(\kappa_{th})(\kappa_0)$, where $\kappa_e$ is the thermal conductivity of the first non-temperature dependent thermally conductive material, $\kappa_{th}$ is the thermal conductivity of the high temperature activated temperature dependent thermally conductive material, and $\kappa_e$ is the thermal conductivity of the second non-temperature dependent thermally conductive material. In one example, $\kappa_e$ is the thermal conductivity of the peripheral region 114, $\kappa_0$ is the thermal conductivity of the target region 112, and $\theta_{th}$ is the thermal conductivity of one of the temperature activated temperature dependent thermally conductive segments 142, 144 of the metallization array 120, depicted in FIG. 1. While not intending to be limited by theory, the thermal switch 100 using materials having thermal conductivities which meet the above condition operates such that thermal contours outside of the metallization array 120 and the target region 112 are undisturbed by heat flux alteration. Further, this condition can allow the metallization array 120 to provide an actively controlled relatively isothermal target region 112 and concentrate heat flux for either increased cooling efficiency or for thermal energy harvesting on the target region 112.

Referring again to FIG. 1, the example metallization array 120 is arranged as a circular band 140, which may be a donut shape, ring shape, annular shape, or the like, such that the circular band 140 circumscribes the target region 112. The circular band 140 may be other shapes, for example, a disc shape or wafer shape that does not circumscribe the target region 112. It should be understood that the metallization array 120 may alternatively be linearly or arbitrarily arranged (see FIGS. 7-8).

Referring still to FIG. 1, the first temperature dependent thermally conductive metallization segments 142 comprise a plurality of concentric rings and the second temperature dependent thermally conductive metallization segments 144 comprise a plurality of spokes. In some embodiments, each individual spoke 144 extends between at least two concentric rings 142. For example, each individual spoke 144 may extend from the first side 126 of the metallization array 120 to the second side 128 of the metallization array 120. The plurality of spokes 144 may include spokes 144 having a continuous width and/or a tapered width. For example, the width of an individual spoke 144 may taper from a larger width at the second side 128 of the metallization array 120 to a smaller width at the first side 126 of the metallization array 120.

As depicted in FIG. 1, the plurality of spokes 144 and the plurality of concentric rings 142 are arranged in a pattern such that one or more of the plurality of concentric rings 142 comprise a plurality of intermittently arranged arcs 145. The arcs 145 are separated by spokes 144. For example, when viewed in a circumferential direction, each arc 145 of an individual concentric ring 142 is separated from another individual adjacent arc 145 of the individual concentric ring 142 by an individual spoke 144. In other embodiments, the plurality of spokes 144 and the plurality of concentric rings 142 can be arranged in an overlapping hatch pattern such that one or more of the plurality of spokes 144 extends under and/or over one or more of the plurality of concentric rings 142, such that each concentric ring 142 continuously encircles the target region 112.

In operation, the metallization array 120 of the thermal switch 100 provides a heat flux amplifier on the target region 112 within a first temperature range (i.e., directs heat flux toward the target region 112), and provides a heat flux shield on the target region 112 within a second temperature range (i.e., directs heat flux away from the target region 112). An average temperature of the first temperature range can be higher or lower than an average temperature of the second temperature range, depending on the material arrangement of the metallization array 120, as described below. Further, within the threshold temperature range, the metallization array 120 switches between providing a heat flux amplifier and providing a heat flux shield. This switch can occur rapidly, for example within one or two degrees Celsius, or gradually, for example, across ten to twenty degrees Celsius. The threshold temperature range may be any range. The average temperature of the threshold temperature range may be any temperature, for example room temperature.

Further, the average temperature of the threshold temperature range comprises a temperature positioned between the average temperature of the first temperature range and the average temperature of the second temperature range. At temperatures below the threshold temperature range, the thermal switch 100 can provide a heat flux amplifier or a heat flux shield depending on the arrangement of the low and high temperature activated temperature dependent thermally conductive materials. At temperatures above the threshold temperature range, the thermal switch 100 can provide a heat flux amplifier or heat flux shield depending on the arrangement of the low and high temperature activated temperature dependent thermally conductive materials.

As depicted in FIG. 1, the target region 112 is illustrated as having a first measurement point 160 and a second measurement point 162. In some operations of the thermal switch 100, the first measurement point 160 and the second measurement point 162 are the same temperature or different temperatures, i.e., the heat flux within the target region is uniform or non-uniform. The uniformity of the heat flux within the target region may be affected by the application of heat to the thermal switch 100, the operation of the metallization array 120, or a combination thereof. For example, as described below with respect to FIGS. 3A and 3B, below, when heat is applied to one side of the substrate 110, the first measurement point 160 and the second measurement point 162 may be at approximately the same temperature during a heat flux shielding operation and may have different temperatures during a heat flux amplification operation.

In one non-limiting example, when the plurality of concentric rings 142 comprise low temperature activated temperature dependent thermally conductive material and the plurality of spokes 144 comprise high temperature activated temperature dependent thermally conductive material, the metallization array 120 provides a heat flux amplifier with respect to the target region 112 at temperatures above a threshold or threshold range and provides a heat flux shield on the target region 112 at temperatures below a threshold or threshold range. In another non-limiting example, when the plurality of concentric rings 142 comprise high temperature activated temperature dependent thermally conductive material and the plurality of spokes 144 comprise low temperature activated temperature dependent thermally conductive material, the metallization array 120 provides a heat flux amplifier with respect to the target region 112 at temperatures below a threshold or threshold range and provides a heat flux shield on the target region 112 at temperatures above a threshold or threshold range.

Figure 3:
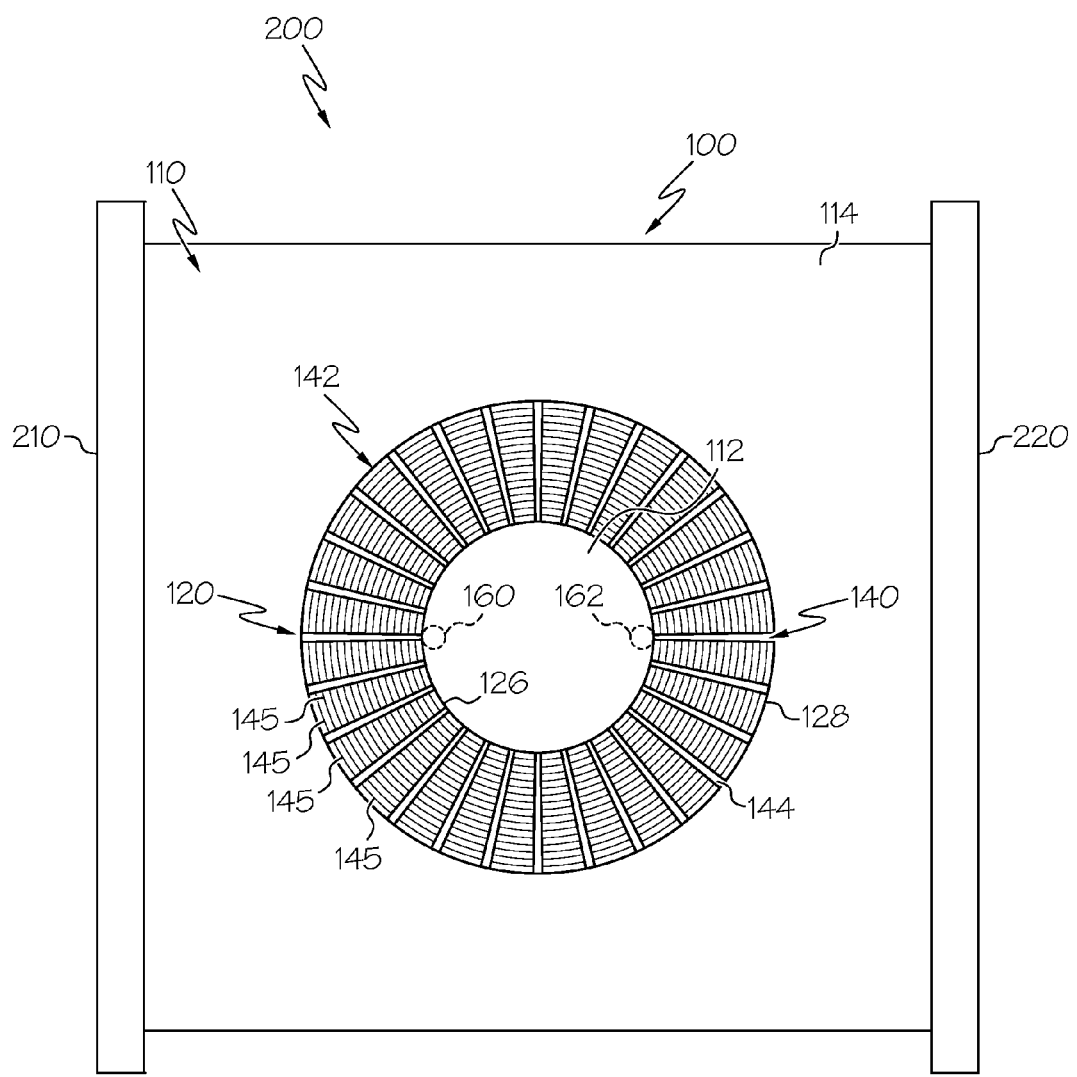
FIG. 3 schematically depicts a top view of an example electronics device including a thermal switch having a metallization array arranged in a circular band according to one or more embodiments described herein.

Referring now to FIG. 3, an example of device 200 is depicted (e.g., an electronics device). The electronics device 200 includes the thermal switch 100 of FIG. 1, a heat sink 210, and a heat source 220. In the electronics device 200, the heat source 220 may be a semiconductor device. In some embodiments, the device 200 may comprise multiple heat sinks 210 and/or multiple heat sources 220. As depicted in FIG. 3, the heat sink 210 and the heat source 220 are thermally coupled to the peripheral region 114 of the substrate 110 at opposite sides of the substrate 110. It should be understood that the heat sink 210 and the heat source 220 may be thermally coupled to the substrate 110 in any location of the substrate 110 and in any manner of thermal coupling. In operation, the metallization array 120 can operate as a heat flux shield and a heat flux amplifier with respect to the target region 112. For example, when the heat source 220 provides heat within a first temperature range, the metallization array 120 can provide a heat flux shield with respect to the target region 112, and when the heat source 220 provides heat within a second temperature range, the metallization array 120 can provide a heat flux amplifier with respect to the target region 112.

Figure 4:
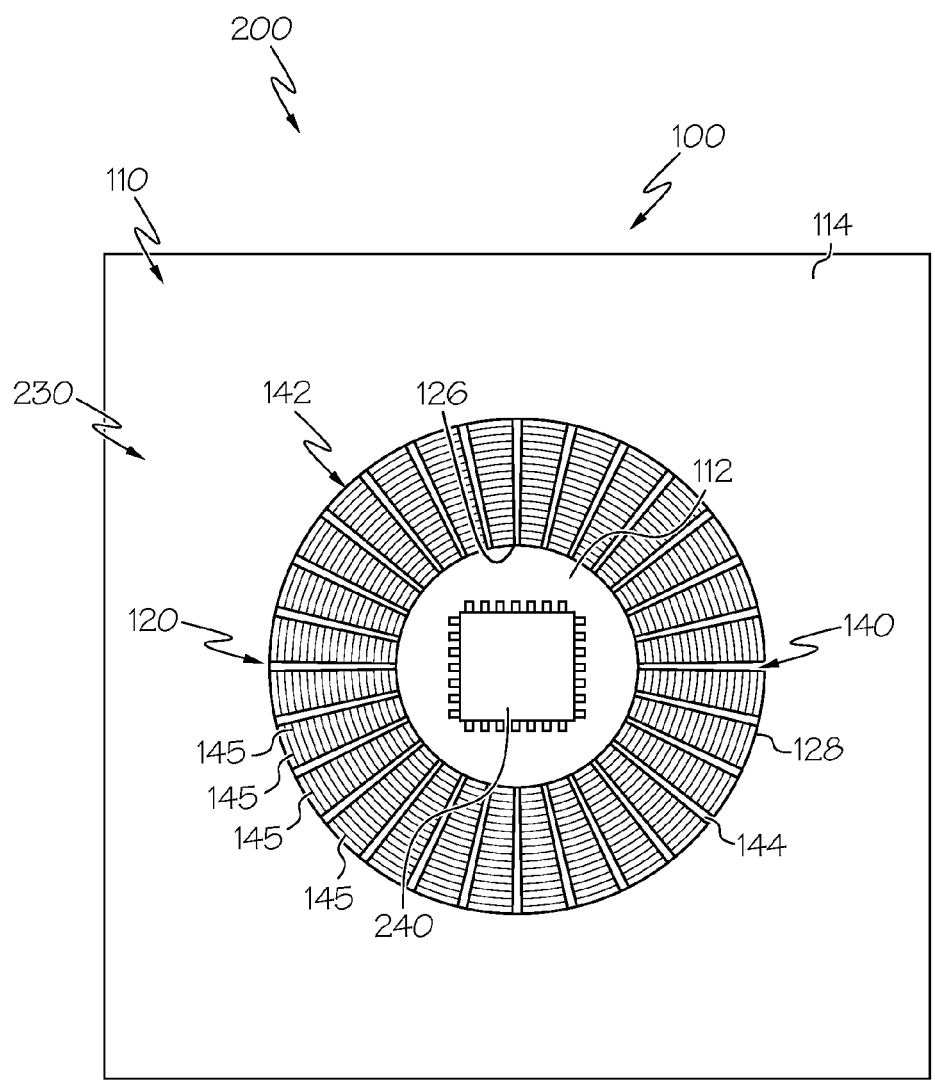
FIG. 4 schematically depicts a top view of another example electronics device including a thermal switch having a metallization array arranged in a circular band according to one or more embodiments described herein.

Referring now to FIG. 4, another embodiment of an electronics device 200 including a semiconductor device 240 positioned within the target region 112 of the thermal switch 100 of FIG. 1 is depicted. In operation, as described below, the metallization array 120 can operate as a heat flux shield and a heat flux amplifier with respect to the target region 112 of the substrate 110 depending, in this embodiment, on the temperature of the semiconductor device 240. Further, the substrate 110 may comprise a printed circuit board 230 and the semiconductor device 240 can be in electronic communication with other components of the printed circuit board 230 (e.g., components positioned within the peripheral region 114 of the printed circuit board 230). The electronics device 200 of FIG. 3 can also include a heat sink 210.

Figure 5A:
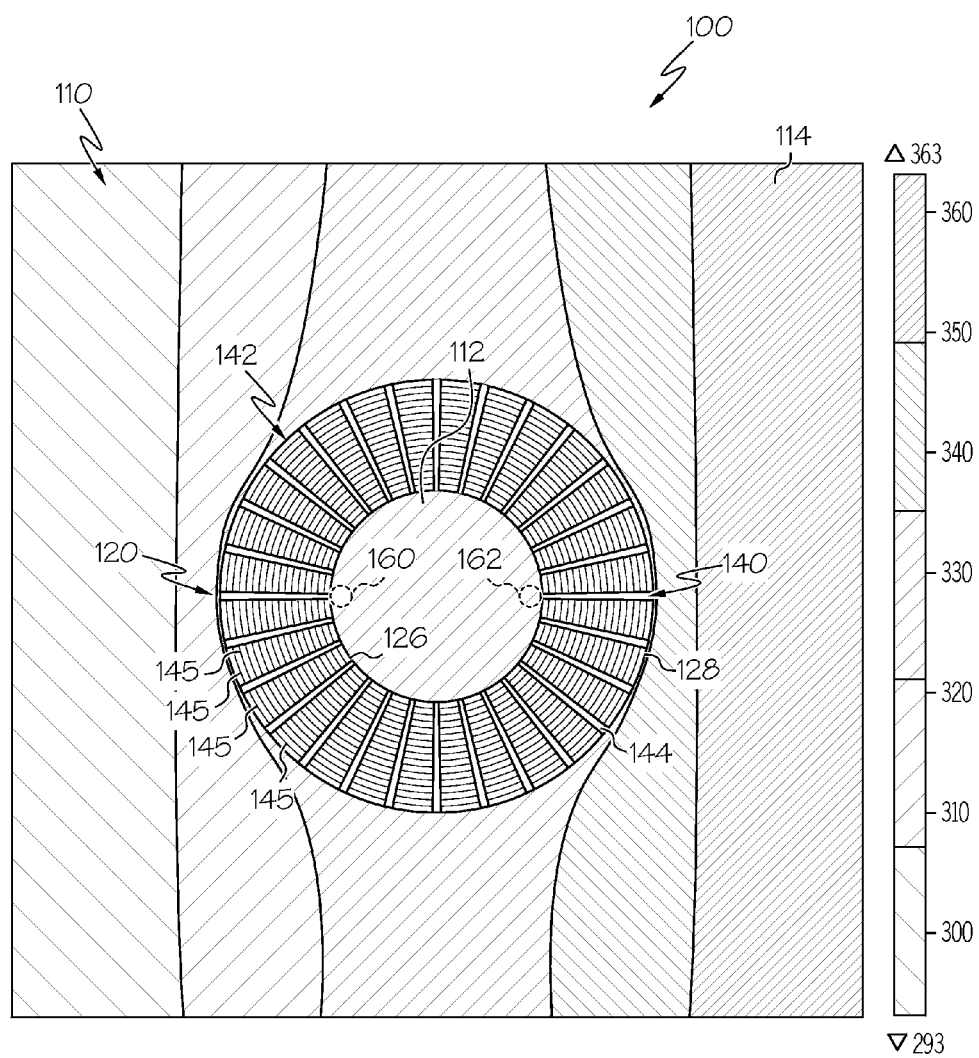
FIG. 5A schematically depicts a top view of a heat pattern of the electronics device of FIG. 3 during an example operation at a first temperature according to one or more embodiments described herein.
Figure 5B:
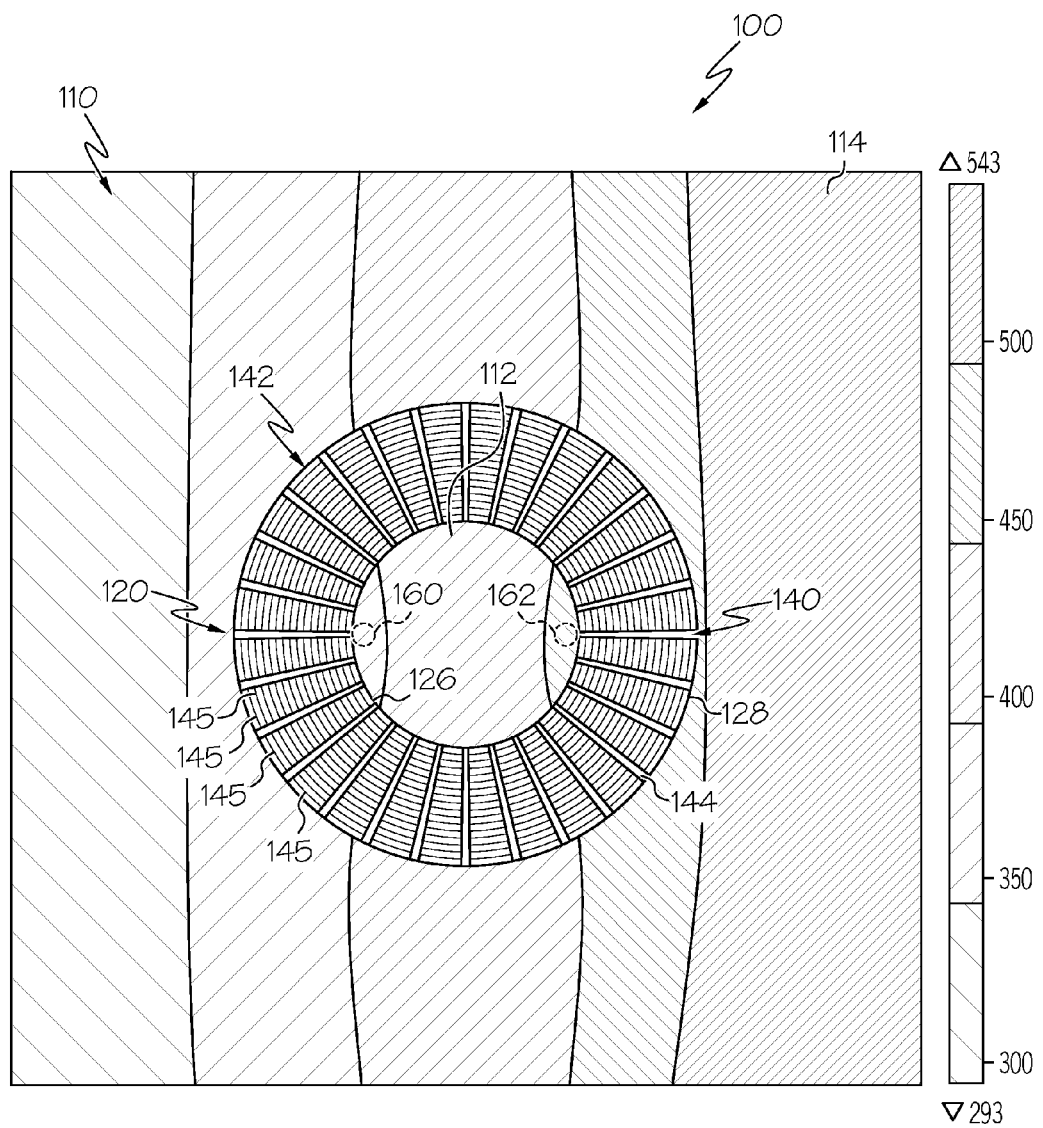
FIG. 5B schematically depicts a top view of a heat pattern of the electronics device of FIG. 3 during an example operation at a second temperature according to one or more embodiments described herein.

Referring now to FIGS. 5A and 5B, heat flux measurements of an example thermal switch 100 as shown in the electronics device 200 are depicted. In this operation, heat is applied on one side of the thermal switch 100 (for example, by a heat source 220 as depicted in FIG. 3). In FIG. 5A, heat is applied to the thermal switch 100 at a first, lower temperature, for example, 363 K. At this temperature, the thermal switch 100 acts as a heat flux shield with respect to the target region 112, thereby retaining a temperature of around 330 K at both a first measurement point 160 and a second measurement point 162 within the target region 112 despite the second measurement point 162 being closer to the heat source than the first measurement point 160.

In FIG. 5B, heat is applied to the thermal switch 100 at a second, higher temperature, for example 543 K. At this temperature, the thermal switch 100 acts as a heat flux amplifier with respect to the target region 112, retaining a temperature of about 350 K at the first measurement point 160 within the target region 112 and about 450 K at the second measurement point 162 within the target region 112. It should be understood that the threshold temperature range in which the thermal switch 100 switches operation is a range positioned between 363 K and 543 K. In the embodiments of FIGS. 5A and 5B, the concentric rings 142 comprise a low temperature activated temperature dependent thermally conductive material and the spokes 144 comprise a high temperature activated temperature dependent thermally conductive material.

Figure 6A:
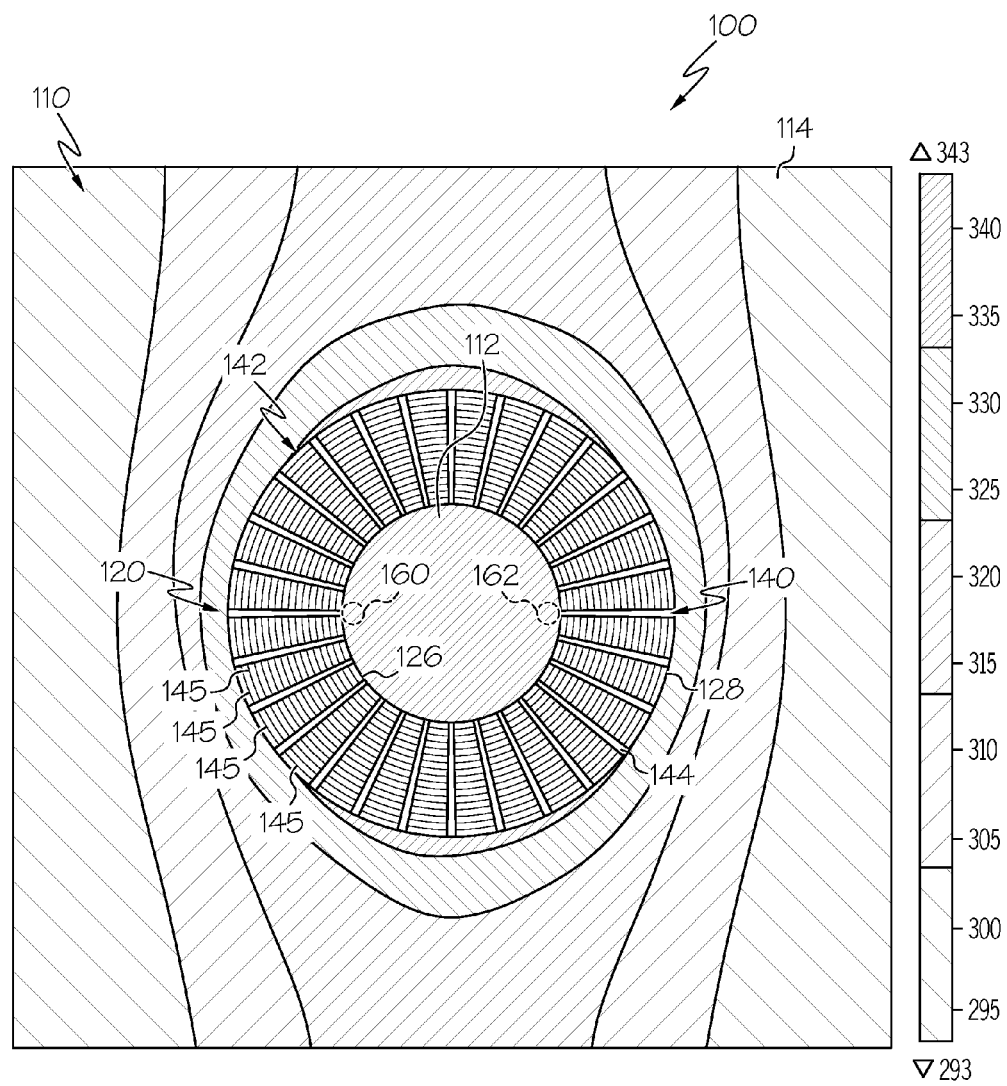
FIG. 6A schematically depicts a top view of a heat pattern of the electronics device of FIG. 4 during an example operation at a first temperature according to one or more embodiments described herein.
Figure 6B:
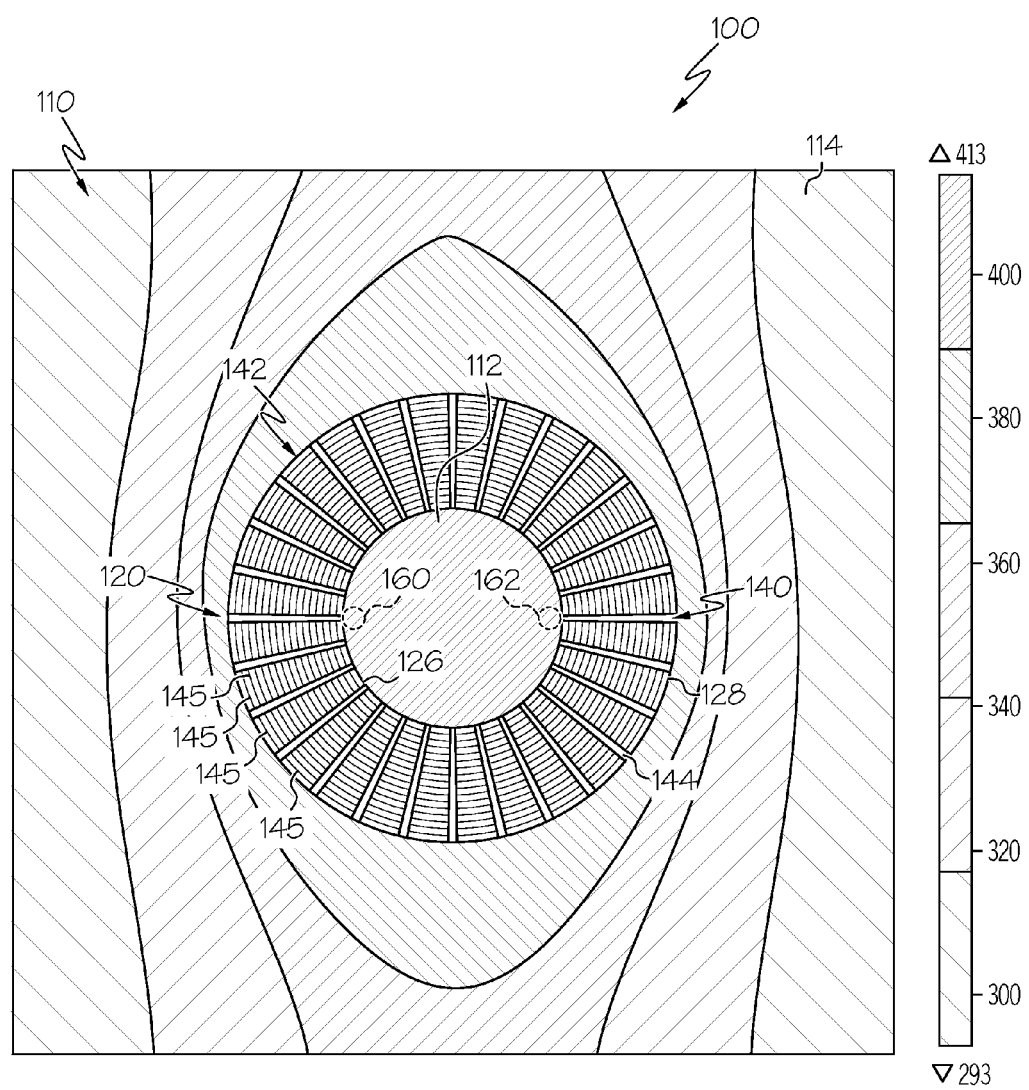
FIG. 6B schematically depicts a top view of a heat pattern of the electronics device of FIG. 4 during an example operation at a second temperature according to one or more embodiments described herein.

Referring now to FIG. 6A, another example thermal switch 100 operation is depicted. In this operation, heat is applied to the target region 112 of the substrate 110 (for example, the electronics device 200 of FIG. 3). In FIG. 6A, about 343 K is applied to the target region 112 and in FIG. 6B, about 413 K is applied to the target region 112. In FIG. 6A, the thermal switch 100 acts as a heat flux shield with respect to the target region 112, retaining heat flux within the target region 112. In FIG. 6B the thermal switch 100 acts as a heat flux amplifier with respect to the target region 112, thereby releasing some of the heat flux into the surrounding peripheral region 114. It should be understood that in the embodiments depicted in FIGS. 5A, 5B, 6A, and 6B, the shape of the heat flux lines may be dependent on the shape of the metallization array 120, the shape of the target region 112, the boundary conditions of the substrate 110, or a combination thereof.

Figure 7:
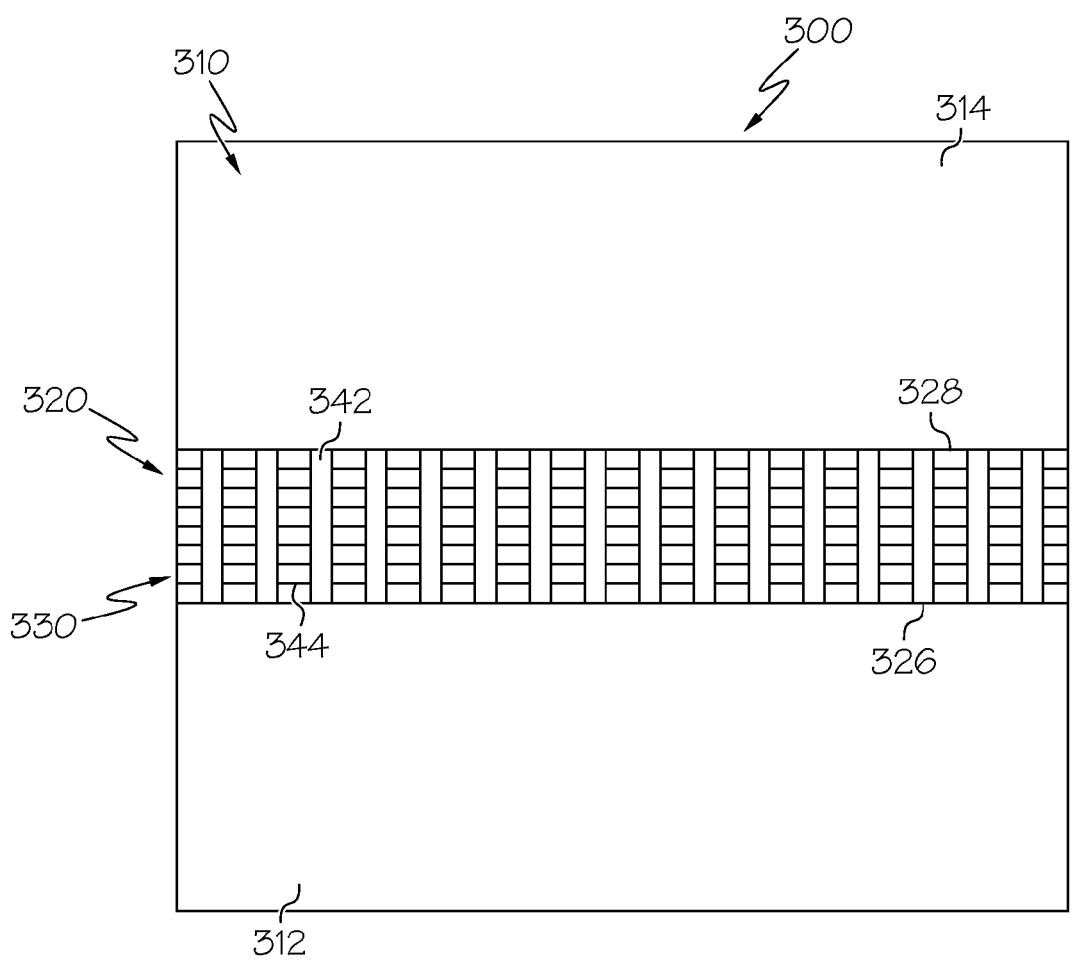
FIG. 7 schematically depicts a top view of an example thermal switch having a metallization array arranged in a linear band according to one or more embodiments described herein.

Referring now to FIG. 7, another embodiment of the thermal switch 300 is depicted. In this embodiment, the metallization array 320 is coupled to the substrate 310 and comprises a linear band 330 that bisects the substrate 310 such that the target region 312 of the substrate 310 is positioned adjacent a first side 326 of the metallization array 320 and the peripheral region 314 is positioned adjacent a second, opposite side 328 of the metallization array 320. In some embodiments, the metallization array 320 can traverse the length or width of the substrate 310. In other embodiments, the metallization array 320 may extend across a portion of the substrate 310 and terminate at a non-edge portion of the substrate 310.

The example metallization array 320 comprises a plurality of first temperature dependent thermally conductive metallization segments 342 and a plurality of second temperature dependent thermally conductive metallization segments 344 arranged as shown in FIG. 7. For example, the first and second temperature dependent thermally conductive metallization segments 342, 344 may be arranged in an overlapping hatch pattern, a non-overlapping hatch pattern, a basket pattern, a non-parallel pattern, or the like. In some embodiments, the first and second temperature dependent thermally conductive metallization segments 342, 344 each comprise one of the low temperature activated temperature dependent thermally conductive materials and the high temperature activated temperature dependent thermally conductive materials, such that the metallization array 120 can provide a heat flux shield or a heat flux amplifier on the target region 112 of the substrate 110 depending on the arrangement of the materials, as described above with respect to FIG. 1.

Figure 8:
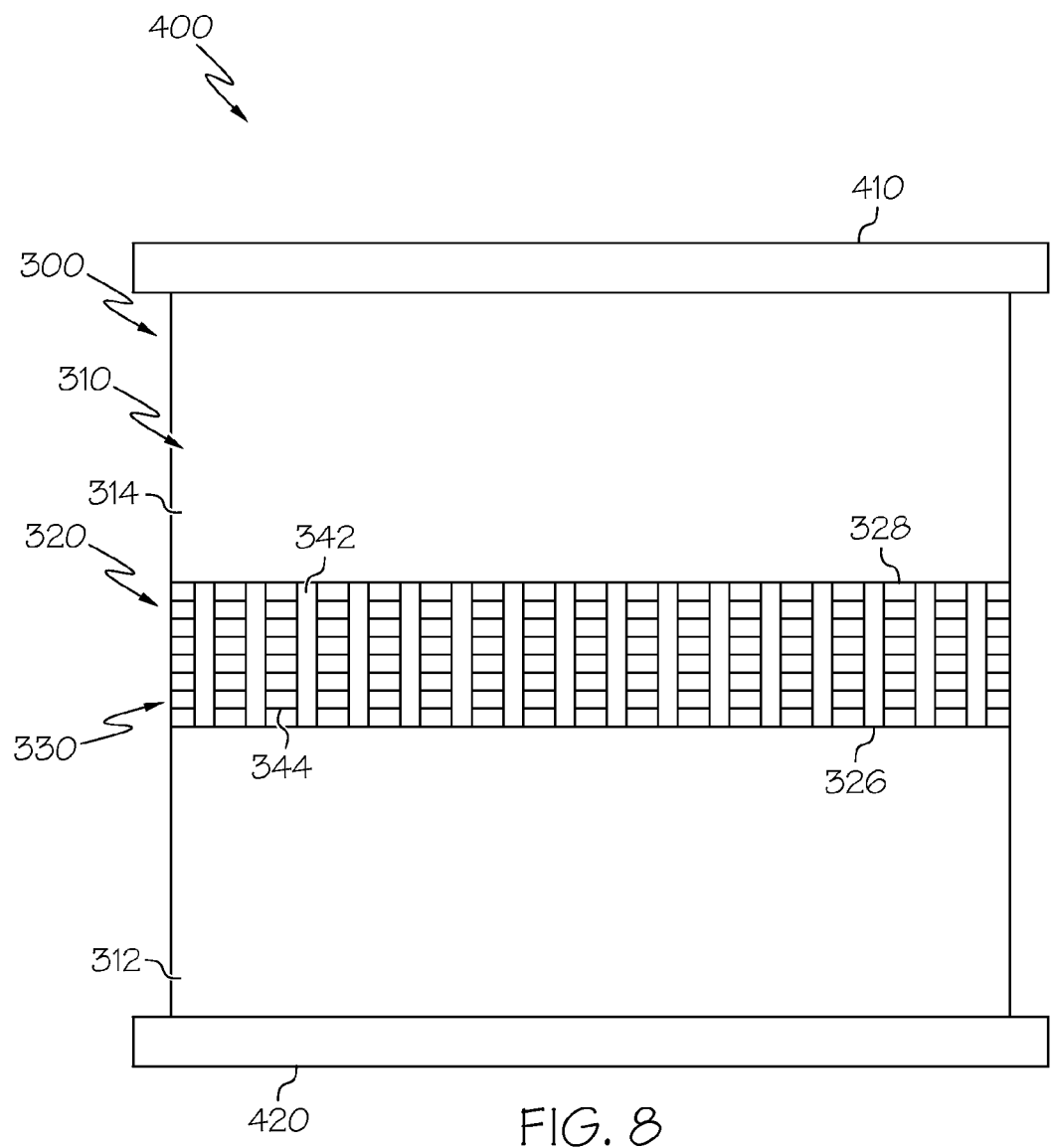
FIG. 8 schematically depicts a top view of an example electronics device including a thermal switch having a metallization array arranged in a linear band according to one or more embodiments described herein.

Referring now to FIG. 8, an embodiment of the electronics device 400 including the thermal switch 300 of FIG. 7 is depicted. In this embodiment, the electronics device 400 includes a heat sink 410 thermally coupled to the peripheral region 314 and a heat source 420 thermally coupled to the target region 312. In this embodiment, the metallization array 320 can focus heat flux onto the target region 312 within a first temperature range and shield heat flux from the target region 312 within a second temperature range. It should be understood that in some embodiments the heat sink 410 can be thermally coupled to the target region 312 and the heat source 420 can be thermally coupled to the peripheral region 314. Further, it should be understood that the metallization array 320 can provide a heat flux shield or a heat flux amplifier on the target region 312 of the substrate 310 depending on the arrangement of the materials, as described above with respect to FIG. 1.

Embodiments of the thermal switches described herein may be scalable, may be a variety of sizes, and may be incorporated into a variety of devices. In some embodiments, the thermal switch 100 is coupled to a printed circuit board 230 to control heat flux of a thermoelectric or thermogalvanic device thermally coupled to the target region 112. In operation, the metallization array 120 provides a heat flux amplifier, focusing heat flux within the target region 112 to allow the thermoelectric device to capture heat energy when the thermal switch 100 is below the threshold temperature range. Above the threshold temperature range, the thermal switch 100 acts as a heat flux shield, thereby releasing heat flux, which may prevent the thermoelectric device from overheating. In such embodiments, the materials of the metallization array 120 may be chosen such that the threshold temperature range is less than an overheating temperature of the thermoelectric device. By thermally coupling the thermoelectric device to the thermal switch 100, the thermoelectric device can maximize the amount of heat energy applied to the thermoelectric device while protecting the thermoelectric device from overheating.

In another embodiment, the thermal switch 100 may be a component of a logic gate device such when the thermal switch 100 provides heat flux amplification within the target region 112, the logic gate device reads this input as a logic one, and when the thermal switch provides heat flux shielding within the target region 112, the logic gate device reads this input as a logic zero, or vice versa.

In another embodiment, the linear band arrangement of the metallization array 120 described above with respect to FIGS. 7-8 may be incorporated into a battery. For example, a metallization array 120 arranged as a linear band 130 may be disposed within a wall of a battery to prevent large temperature fluctuations within the battery. At lower temperatures, the metallization array 120 may operate as a heat flux shield and retain heat within the battery. At higher temperatures the metallization array 120 may operate as a heat flux amplifier and release heat flux from the battery. In still other embodiments, the metallization array 120 may extend into the substrate 110. For example, the substrate 110 may be a block of non-temperature dependent thermally conductive material and the low and high temperature activated temperature dependent thermally conductive segments 142, 144 may extend into the substrate 110. This arrangement may be incorporated into any of the embodiments described herein. It should be understood that the above described applications of the thermal switch 100 are merely illustrative examples and do not constitute an exhaustive list of applications.

It should now be understood that thermal switches having a metallization array may be configured to provide active heat flux alteration on a target region of a substrate. The metallization array may be an arrangement of temperature dependent thermally conductive metallization segments coupled to the substrate, for example, low and high temperature activated temperature dependent thermally conductive materials. A single metallization array can provide a heat flux shield within a first temperature range and a heat flux amplifier within a second temperature range. The metallization array can switch between a heat flux shield and a heat flux amplifier within a threshold temperature range positioned between the first and second temperature ranges. Further, depending on the arrangement of the materials of the metallization array, the metallization array can provide a heat flux shield at high or low temperatures and can provide a heat flux amplifier at high or low temperatures.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A thermal switch comprising:
a substrate having a target region and a peripheral region; and
a metallization array coupled to the substrate and positioned adjacent the target region, the metallization array comprising:
a plurality of first temperature dependent thermally conductive metallization segments; and a plurality of second temperature dependent thermally conductive metallization segments, wherein the metallization array amplifies and directs heat flux toward the target region within a first temperature range, and directs heat flux away from the target region within a second temperature range.

2. The thermal switch of claim 1, wherein the metallization array is arranged in a linear band, such that:
each individual first temperature dependent thermally conductive metallization segment of the plurality of first temperature dependent thermally conductive metallization segments is adjacent to at least one individual second temperature dependent thermally conductive metallization segment of the plurality of second temperature dependent thermally conductive metallization segments; and
the metallization array bisects the substrate such that the target region is adjacent a first side of the metallization array and the peripheral region is adjacent a second, opposite side of the metallization array.

3. The thermal switch of claim 2, wherein the plurality of first temperature dependent thermally conductive metallization segments comprises at least one of $Al_2O_3$, Sapphire, and BeO.

4. The thermal switch of claim 2, wherein the plurality of second temperature dependent thermally conductive metallization segments comprises at least one of $VO_2$, $SmNiO_3$, $TiO_3$, a transition metal perovskite, ZnBiTeSe, and $FeSb_2$.

5. The thermal switch of claim 1, wherein the metallization array is arranged in a circular band, such that:
each individual first temperature dependent thermally conductive metallization segment of the plurality of first temperature dependent thermally conductive metallization segments is adjacent to at least one individual second temperature dependent thermally conductive metallization segment of the plurality of second temperature dependent thermally conductive metallization segments; and
the metallization array circumscribes the target region such that the target region is adjacent a first side of the metallization array and the peripheral region is adjacent a second, opposite side of the metallization array.

6. The thermal switch of claim 5, wherein:
the plurality of first temperature dependent thermally conductive metallization segments comprises a plurality of concentric rings circumscribing the target region and the plurality of second temperature dependent thermally conductive metallization segments comprises a plurality of spokes; and
each individual spoke extends between at least two concentric rings of the plurality of first temperature dependent thermally conductive metallization segments.

7. The thermal switch of claim 6, wherein the plurality of first temperature dependent thermally conductive metallization segments comprises at least one of $Al_2O_3$, Sapphire, and BeO.

8. The thermal switch of claim 6, wherein the plurality of second temperature dependent thermally conductive metallization segments comprises at least one of $Al_2O_3$, Sapphire, and BeO.

9. The thermal switch of claim 6, wherein the plurality of first temperature dependent thermally conductive metallization segments comprises at least one of $VO_2$, $SmNiO_3$, $TiO_3$, a transition metal perovskite, a narrow bandgap semiconductor material, a phase change material, ZnBiTeSe, and $FeSb_2$.

10. The thermal switch of claim 6, wherein the plurality of second temperature dependent thermally conductive metallization segments comprises at least one of $VO_2$, $SmNiO_3$, $TiO_3$, a transition metal perovskite, a narrow bandgap semiconductor material, a phase change material, ZnBiTeSe, and $FeSb_2$.

11. The thermal switch of claim 1, wherein the substrate comprises FR-4, copper, or a combination thereof.

12. The thermal switch of claim 1, wherein a material of the target region is different than a material the peripheral region.

13. A device comprising:
a thermal switch comprising:
a substrate having a target region and a peripheral region; and
a metallization array coupled to the substrate and positioned adjacent the target region, the metallization array comprising:
a plurality of first temperature dependent thermally conductive metallization segments; and
a plurality of second temperature dependent thermally conductive metallization segments, wherein the metallization array amplifies and directs heat flux toward the target region within a first temperature range, and directs heat flux away from the target region within a second temperature range;
a heat sink thermally coupled to the target region of the substrate and/or the peripheral region of the substrate; and
a heat source thermally coupled to the target region of the substrate and/or the peripheral region of the substrate.

14. The device of claim 13, wherein the metallization array is arranged in a linear band such that:
each individual first temperature dependent thermally conductive metallization segment of the plurality of first temperature dependent thermally conductive metallization segments is adjacent to at least one individual second temperature dependent thermally conductive metallization segment of the plurality of second temperature dependent thermally conductive metallization segments; and
the metallization array bisects the substrate such that the target region is adjacent a first side of the metallization array and the peripheral region is adjacent a second, opposite side of the metallization array.

15. The device of claim 13, wherein the metallization array is arranged in a circular band such that:
each individual first temperature dependent thermally conductive metallization segment of the plurality of first temperature dependent thermally conductive metallization segments is adjacent to at least one individual second temperature dependent thermally conductive metallization segment of the plurality of second temperature dependent thermally conductive metallization segments; and
the metallization array circumscribes the target region such that the target region is adjacent a first side of the metallization array and the peripheral region is adjacent a second, opposite side of the metallization array.

16. The device of claim 13, wherein the substrate is a printed circuit board and the heat source comprises a semiconductor device.

17. A thermal switch comprising:
a substrate having a target region and a peripheral region; and
a metallization array coupled to the substrate and arranged in a circular band, the metallization array comprising:

a plurality of low temperature activated temperature dependent thermally conductive metallization segments comprising a plurality of concentric rings that circumscribe the target region; and a plurality of high temperature activated temperature dependent thermally conductive metallization segments comprising a plurality of spokes, wherein each individual spoke extends between at least two concentric rings of the plurality of low temperature activated temperature dependent thermally conductive metallization segments, wherein:

the metallization array directs heat flux toward the target region within a first temperature range, and directs heat flux away from the target region within a second temperature range; and the first temperature range has a first average temperature that is lower than a second average temperature of the second temperature range.

18. The thermal switch of claim 17, wherein the plurality of low temperature activated temperature dependent thermally conductive metallization segments comprises at least one of $Al_2O_3$, Sapphire, and BeO.

19. The thermal switch of claim 17, wherein the plurality of high temperature activated temperature dependent thermally conductive metallization segments comprises at least one of $VO_2$, $SmNiO_3$, $TiO_3$, a transition metal perovskite, a narrow bandgap semiconductor material, a phase change material, ZnBiTeSe, and $FeSb_2$.

20. The thermal switch of claim 17, wherein the substrate comprises one of FR-4, copper, or a combination thereof.

* * * * *